(12) United States Patent
Fan (10) Patent No.: US 9,042,067 B2
(45) Date of Patent: May 26, 2015

(54) BATTERY TESTER (71) Applicant: Danaher (Shanghai) Industrial Instrumentation Technologies R&D Co., Ltd., Shanghai (CN)

(72) Inventor: Songnan Fan, Shanghai (CN)

(73) Assignee: Danaher (Shanghai) Industrial Instrumentation Technologies R&D Co., Ltd., Shanghai (CN)

( * ) Notice: Subject to any disclaimer, the term of this patent is extended or adjusted under 35 U.S.C. 154(b) by 179 days.

(21) Appl. No.: 13/927,005

(22) Filed: Jun. 25, 2013

(65) Prior Publication Data

US 2014/0092512 A1 Apr. 3, 2014

(30) Foreign Application Priority Data

Sep. 29, 2012 (CN) .......................... 2012 1 0377927

(51) Int. Cl.
*G01R 31/36* (2006.01)
*H02H 3/08* (2006.01)
*H02H 3/20* (2006.01)

(52) U.S. Cl.
CPC ........ *G01R 31/3606* (2013.01); *G01R 31/3624* (2013.01); *G01R 31/3648* (2013.01); *G01R 31/3662* (2013.01); *G01R 31/3627* (2013.01); *H02H 3/08* (2013.01); *H02H 3/20* (2013.01)

(58) Field of Classification Search
CPC ........... G01R 31/3662; G01R 31/3624; G01R 31/3648; H02H 3/20; H02H 3/08
USPC .......................................................... 361/91.1
See application file for complete search history.

(56) References Cited

U.S. PATENT DOCUMENTS

| | | | | |
|---|---|---|---|---|
| 4,297,639 A | * | 10/1981 | Branham | ....................... 324/429 |
| 8,203,345 B2 | * | 6/2012 | Bertness | ....................... 324/426 |
| 2007/0244660 A1 | * | 10/2007 | Bertness et al. | .............. 702/108 |

* cited by examiner

*Primary Examiner* — Scott Bauer
(74) *Attorney, Agent, or Firm* — Christensen O'Connor Johnson Kindness PLLC (57) ABSTRACT A battery tester capable of measuring resistance and voltage of a battery using the same input channel. When measuring battery resistance, a testing signal circuit is electrically coupled to two electrodes of a subject battery to conduct a testing signal used in the battery resistance measurement. A response sensing circuit of the battery tester is also electrically coupled to the two electrodes of the subject battery to measure a response signal across the two electrodes of the subject battery. A resistance measuring module is electrically coupled to the response sensing circuit to measure the battery resistance based on the response signal detected by the response sensing circuit. A circuit breaker is capable of disconnecting the subject battery from the testing signal circuit, and disconnecting the resistance measuring module from the response sensing circuit. Moreover, the battery tester can also provide automatic protection for the battery resistance measuring module.

34 Claims, 4 Drawing Sheets

BATTERY TESTER

TECHNICAL FIELD

The present application relates to a battery tester, particularly a battery tester capable of measuring the internal resistance of a battery.

BACKGROUND

A storage battery is a kind of power supply widely used in industrial manufacturing, transportation, telecommunication, etc. In order to detect power failure or insufficient capacity of a storage battery in advance, and to avoid potential accidents thus caused, there is a need for a full test of operating parameters of the battery. Generally, the working state of a battery can be evaluated by measuring the battery resistance. Currently, commonly used methods for measuring battery resistance include the density method, the open circuit voltage method, the direct current (DC) discharging method, and the alternating current (AC) injection method.

For an Uninterrupted Power Supply (UPS) system, the voltage of a battery bank usually ranges from 400V to 600V. However, conventional devices for measuring battery resistance can only measure voltages lower than 60V. If the voltage across the two electrodes of a battery to be tested ("the subject battery") is too high, or if the current in the circuit is too large, the measuring device may be damaged. For example, an AC current source may be broken due to an over-current in an AC injection circuit when measuring battery resistance using the AC injection method. Even if the AC current supply is protected by a fuse, frequent replacement of broken fuses due to the over-current may be required.

Moreover, in addition to the battery resistance, it may be desirable to measure other parameters of a battery, such as the voltage or load current of the entire battery bank, using the same measuring device without changing its testing probes when measuring the working state of the battery. Since conventional devices for measuring battery resistance are not able to measure high voltages across the battery bank, a user usually needs to use two different measuring devices, one for measuring battery resistance, and another for measuring high voltages across the entire battery bank. Such operation makes the measurement process less convenient.

Thus, there is a desire for a battery tester capable of measuring both an internal resistance and a high voltage of a storage battery bank, that can switch between different measurement functions easily, and can provide protection for circuit components and prevent damage to the battery tester under high voltage/large current conditions.

SUMMARY

The present application provides a new battery tester capable of measuring the internal resistance and other electrical parameters of a battery such as voltages, especially high voltages, across a battery bank. Moreover, a battery tester according to the present application contains an over-voltage and/or over-current protection module to prevent the resistance measuring components from damage caused by high voltage or large current, thereby significantly reducing the frequency of replacing over-voltage/over-current protection components. According to the present application, the measurement range for voltages of a battery tester is expanded up to 600V or higher. The term "high voltage" as used herein generally refers to a voltage higher than 60V, for example, a voltage ranging from 60V to 600V.

In one aspect of the present application, a battery tester capable of measuring the internal resistance of a battery is provided. The battery tester comprises a testing signal circuit, a response sensing circuit, and a resistance measuring module. The testing signal circuit can conduct a testing signal between the battery tester and a subject battery. The response sensing circuit is capable of sensing a response signal from the subject battery. The resistance measuring module is electrically coupled to the response sensing circuit and can obtain the battery resistance value based on the response signal sensed by the response sensing circuit. The battery tester further comprises a circuit breaker, which is set in an off state when the battery tester is not measuring the battery resistance, so as to disconnect the testing signal circuit from the subject battery and to disconnect the resistance measuring module from the response sensing circuit. According to the present application, the circuit breaker can switch between an on state and the off state automatically or manually by a user.

In certain embodiments of the present application, a level value of the response signal is first determined through the response sensing circuit before measuring the battery resistance. If the determined level value of the response signal exceeds a threshold, the circuit breaker remains off. If the determined level value of the response signal does not exceed the threshold, the circuit breaker will be switched to the on state, wherein the testing signal circuit switches on and the resistance measuring module is electrically coupled to the response sensing circuit for measuring the battery resistance. Optionally, the level value of the response signal determined through the response sensing circuit is the voltage across the subject battery. In certain embodiments, the threshold can be set as a voltage of 70V.

Optionally, the resistance measuring module can measure the battery resistance using either an AC injection method or a DC discharging method. When measuring the resistance using the AC injection method, the testing signal circuit has an AC current source configured to send an alternating current signal into the subject battery via the testing signal circuit. Alternatively, when measuring the resistance using the DC discharging method, a test load is coupled in the testing signal circuit such that the discharging current output from the subject battery may flow through the test load via the testing signal circuit.

In certain embodiments, the circuit breakers in the testing signal circuit and/or the response sensing circuit can be relays. For example, two relays can be coupled in the testing signal circuit and in the response sensing circuit, respectively. Moreover, the testing signal circuit and the response sensing circuit may also share a single-pole, double-throw relay as the circuit breaker to control the on/off state of both the testing signal circuit and the response sensing circuit simultaneously. Alternatively, when measuring battery resistance using the AC injection method, for example, the resistance measuring module may be disconnected from the response sensing circuit by arranging a stopping capacitor in the response sensing circuit.

In another aspect of the present application, a battery tester according to the present application may further comprise a measuring module for measuring battery parameters other than the battery resistance, to become a multi-functional tester. For example, the voltage across the subject battery may be measured by using the same battery tester. For another example, the battery tester may switch in function between the multimeter function and the battery bank testing function. In certain embodiments, the circuit breaker is switched off when the battery tester is used for measuring battery parameters other than battery resistance.

In certain embodiments, in order to prevent the high voltage across a battery bank from breaking down the circuit breaker and damaging the battery resistance measuring module, a first over-voltage protection module (i.e., a high-voltage protection module) is coupled in the testing signal circuit to protect the circuit breaker from over-voltage when the circuit breaker is in the off state. Optionally, the rated value of the protection voltage of the first over-voltage protection module is 600V.

In certain embodiments, a first over-current protection module (i.e., a large-current protection module) is coupled in the response sensing circuit to protect the circuit breaker from over-current when the circuit breaker is in the off state. For example, a fuse protector having a rated current of 440 mA may be chosen as the first over-current protection module.

In certain embodiments, in order to protect the battery resistance measuring module when measuring the battery resistance, a second over-voltage protection module (a low-voltage protection module) is coupled in the testing signal circuit and/or the response sensing circuit to protect the testing signal circuit from over-voltage when the circuit breaker is in the on state. For example, the rated value of the protection voltage of the second over-voltage protection module may be 70V.

In certain embodiments, a second over-current protection module (i.e., a small-current protection module) is coupled in the response sensing circuit to protect the circuit breaker from over-current when the circuit breaker is in the on state. For example, a current limiting resistor having a rated current of 200 mA may be chosen as the second over-current protection module.

In certain embodiments, the first and/or second over-voltage protection module may be selected from the following group: a gas discharge tube, a solid discharge tube, a transient voltage suppressor (TVS device), a diode array, a voltage regulator, or a varistor.

In certain embodiments, the first and/or second over-current protection module may be selected from the following group: a positive temperature coefficient thermistor, a fuse, or a current limiting resistor.

In another aspect of the present application, the battery tester described herein further comprises a load current measuring module electrically coupled to the response sensing circuit for measuring a load current.

In another aspect of the present application, the battery tester described herein further comprises a pair of test probes, wherein each of the test probes can be electrically coupled to the testing signal circuit and the response sensing circuit.

In another aspect of the present application, the battery tester described herein further comprises a display for displaying the level of the response signal detected by the response sensing circuit and/or the indications measured by the battery tester. In certain embodiments, the battery tester gives a warning signal if the determined level value of the response signal exceeds a threshold level. The warning signal may be a visible or audible signal for warning the user.

The battery tester of the present application can accurately measure battery resistance (for example, measuring the resistance by using the AC injection method or the DC discharging method), as well as performing other measurement functions such as measuring a voltage across a storage bank, or measuring a load current. When the measured battery response signal exceeds a permitted level range of the resistance measuring component, the user will be notified of such situation, and the resistance measuring function can be turned off via the circuit breaker, therefore protecting the battery tester. In this manner, the battery resistance and other battery parameters can be measured using the same test device without damaging the test device. Moreover, the over-voltage protection and over-current protection features can further prevent the circuit breaker from damages due to a high voltage or large current across the battery, thereby reliably extending the voltage measuring range to an order of magnitude of kilovolts.

DESCRIPTION OF THE DRAWINGS

The aforementioned features and other features of the present application will be further described in the following paragraphs by referring to the accompanying drawings and the attached claims. It will be understood that, these accompanying drawing merely illustrate some embodiments in accordance with the present application and should not be considered as limitation to the scope of the present application. Unless otherwise specified, the accompanying drawings need not be proportional, and similar reference labels generally denote similar elements.

DETAILED DESCRIPTION

The following detailed description refers to the accompanying drawings as a portion of the present application. The illustrative embodiments described in the detailed description, the accompanying drawings, and the claims are not limiting, and other embodiments may be adopted, or modifications may be made without deviating from the spirit and subject of the present application. It should be understood that various aspects of the present application described and graphically presented herein may be arranged, replaced, combined, divided, and designed in many different configurations, and these different configurations are implicitly included in the present application.

In the following paragraphs, certain specific terms will be used to describe the illustrative embodiments. However, the intent of using these terms is not to limit the scope of protection of the present application; rather, the scope of these terms should extend to any equivalent replacements that achieve substantially the same objectives in substantially the same way.

Figure 1:
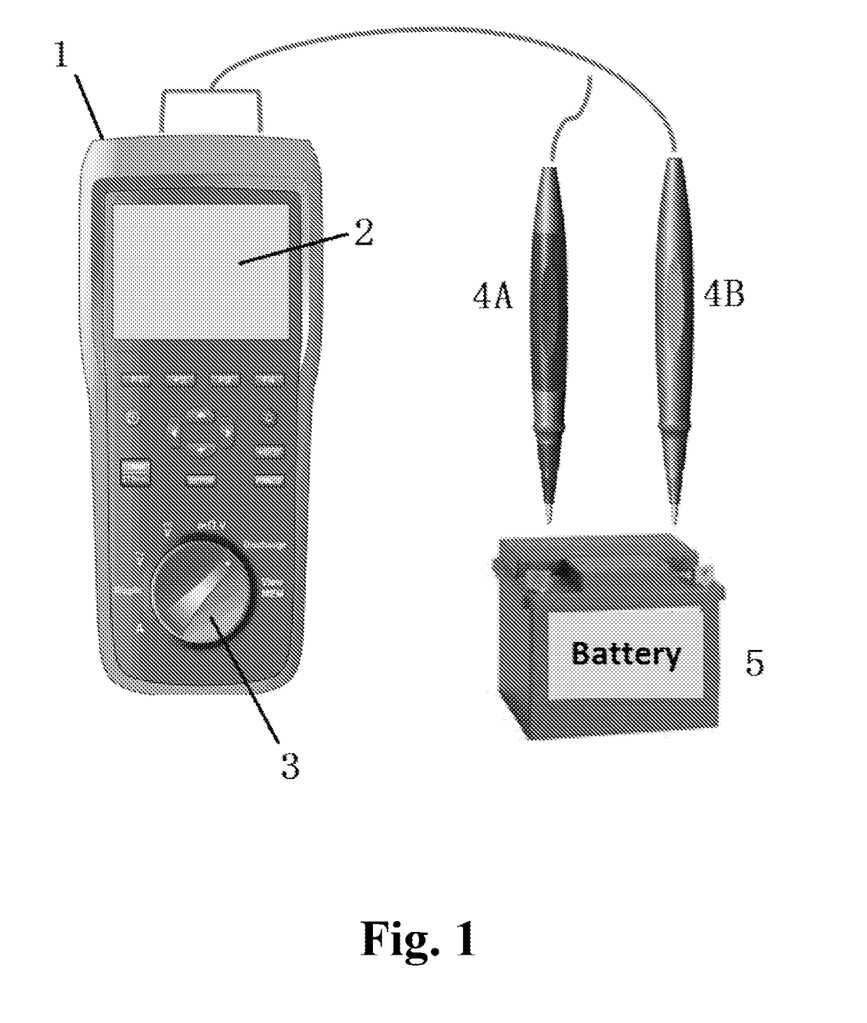
FIG. 1 illustratively shows the overall structure of a battery tester according to an embodiment of the present application.

FIG. 1 illustratively shows the overall design of a battery tester 1 according to the present application. The battery tester 1 comprises a display 2 and a function selector switch 3. The display 2 may present the measured data to a user in a visible manner, and different measuring functions may be selected via the function selector switch 3. The battery tester 1 comprises a pair of external test probes 4A and 4B. When measuring the working parameters of a battery, the test probes 4A, 4B contact the positive and negative electrodes of the battery 5 to be tested, respectively. Each of the test probes includes two leads for electrically coupling a testing signal circuit and a response sensing circuit in the battery tester 1, respectively.

As shown in FIG. 1, soft function keys F1-F4 and a range switching key ("RANGE") are disposed on a panel of the battery tester 1 to enable the user to select different measuring functions or ranges. The keys on the panel of the battery tester 1 shown in FIG. 1 further comprise a power key, a backlight key, a multimeter or battery bank function selecting key ("DMM/String"), a user setup key ("SETUP"), and an indication hold key ("HOLD"). The battery tester 1 shown in FIG. 1 is merely an example. Those skilled in the art may make various modifications to the appearance, panel layout, key configuration, etc., of the battery tester 1 without deviating from the subject and scope of protection of the present application.

Figure 2:
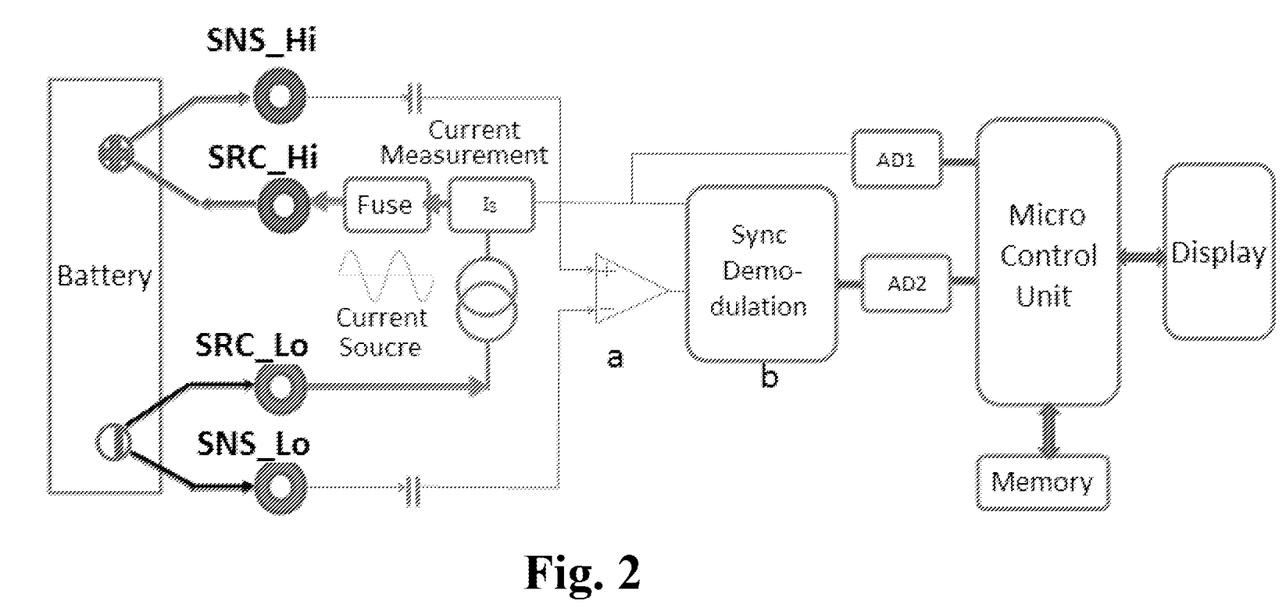
FIG. 2 shows an exemplary schematic for measuring resistance of a battery using an AC injection method according to an embodiment of the present application.

FIG. 2 shows a schematic for measuring resistance of a battery using an AC injection method. Terminals SRC_Hi and SRC_Lo in FIG. 2 are configured to apply an AC testing current IS to the positive and negative electrodes of the subject battery. The terminal SRC_Hi is coupled to an AC current source via an AC current injection circuit, and the terminal SRC_Lo is coupled to ground. The AC current source used in the AC injection method should be sufficiently stable, have a waveform distortion as small as possible, and output, for example, a sinusoidal current of 1 kHz and 100 mA.

Response sensing terminals SNS_Hi and SNS_Lo are configured to detect a response signal between the two electrodes of the subject battery. For example, the potentials detected at the two electrodes of the battery are V_Hi and V_Lo, respectively. Therefore, the voltage response signal is expressed as $\Delta V=V\_Hi-V\_Lo$. The sinusoidal current injected into the two electrodes of the battery is IS. According to Ohm's Law, the impedance of the battery is calculated as $Z=\Delta V/IS$. Assuming the phase difference between the AC current signal and the voltage response signal is $\phi$, the battery resistance is calculated as $R=Z\cos\phi$.

As the phase difference between the AC current signal IS and the voltage response signal $\Delta V$ may interfere with the measurement accuracy, the injected AC current IS and the detected voltage response signal $\Delta V$ may be synchronously demodulated in the resistance measuring module to improve the accuracy of measurement. For example, these two signals may be input into an analog multiplier.

In this improved method, assuming the injected AC current signal $IS=A\cos\omega t$, the measured voltage response signal $\Delta V=B\cos(\omega t+\phi)$, wherein A denotes the maximum amplitude of the AC current signal IS, B denotes the maximum amplitude of the voltage response signal $\Delta V$, $\omega$ denotes the frequency of the injected AC current signal, and $\phi$ denotes the phase difference between the AC current signal IS and the voltage response signal $\Delta V$. After the synchronous demodulation, the obtained signal is expressed as:

$$u(\omega t)=k\times I_S\times \Delta V=kAB\cos\omega t\times\cos(\omega t+\phi)=kAB[\cos\omega+\cos(2\omega t+\phi)]/2 \quad \text{(Equation 1)}$$

wherein k denotes the magnifying ratio of the analog multiplier. After low-pass filtering for filtering out the AC component w, the signal is obtained as:

$$u=kAB\cos\phi/2. \quad \text{(Equation 2)}$$

As the battery resistance is expressed as $R=B\cos\phi/A$, by substituting the above Equation 2 into the formula, the battery resistance is calculated as:

$$R=2u/(kA^2) \quad \text{(Equation 3)}$$

When the parameters k, A in Equation 3 are already known, the resistance of the subject battery can be simply calculated with the measured and processed signal u, while eliminating the interference of the phase difference $\phi$ of the AC signals. The calculation mentioned above can be implemented by using a micro-control unit in the resistance measuring module.

Figure 3:
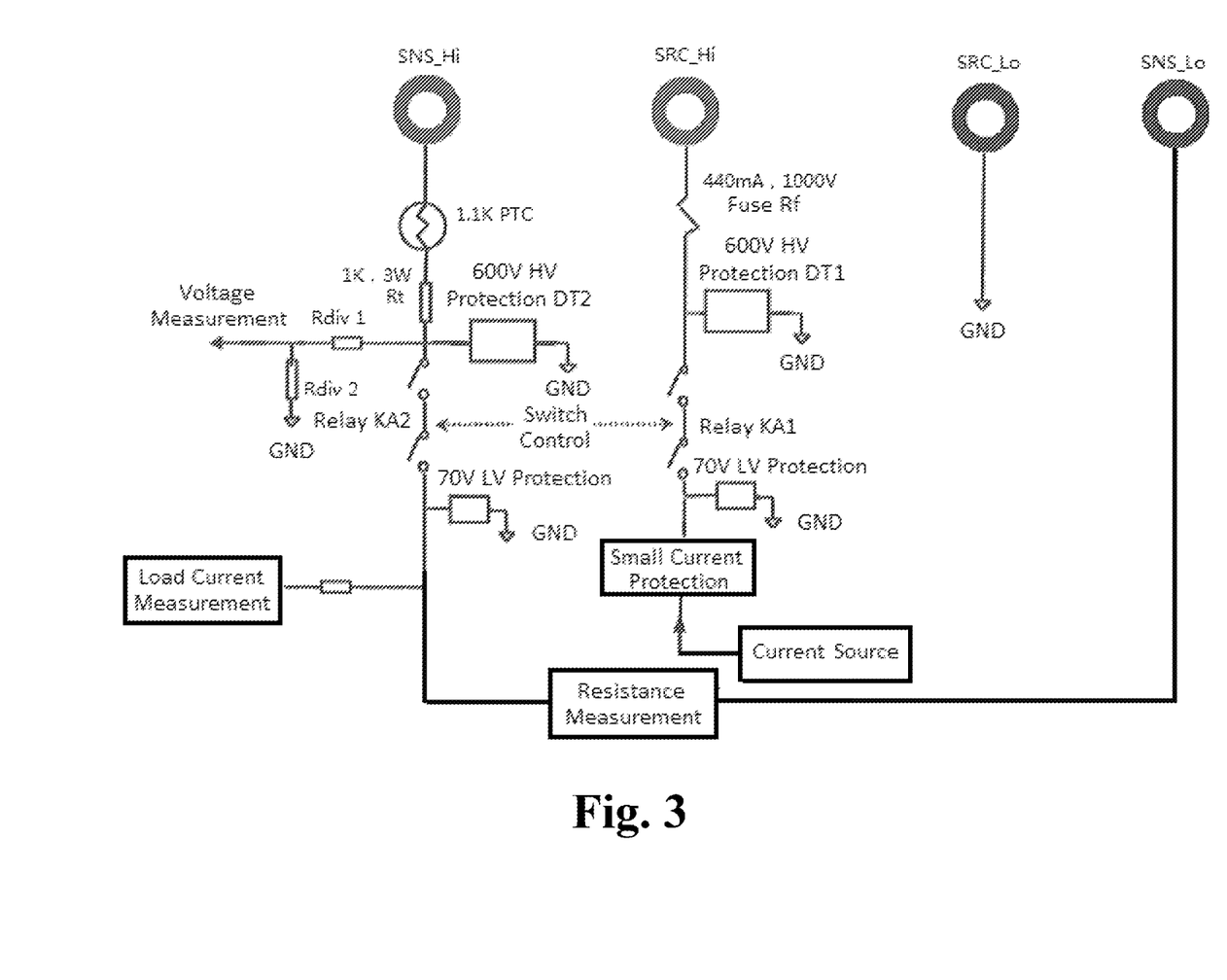
FIG. 3 shows an exemplary circuit diagram of a battery tester according to an embodiment of the present application.

FIG. 3 shows an exemplary circuit diagram of a battery tester according to an embodiment of the present application. As shown in FIG. 3, a relay KA1 serving as a circuit breaker is coupled in the testing signal circuit. Moreover, a relay KA2 serving as a circuit breaker is coupled in the response sensing circuit. In the illustrated embodiment, when the battery tester is performing any measuring functions other than the battery resistance measurement, such as measuring the voltage across the battery bank, these two relays KA1, KA2 are both in an off state. The measured electrical parameters may be displayed to the user by the display 2 shown in FIG. 1.

When measuring the battery resistance, the relays KA1, KA2 are both turned off before the measurement. If the measured value of the response voltage exceeds a predefined threshold voltage, for example, 70V, the relays KA1, KA2 will remain in the off state, and the battery tester may display the battery response voltage $\Delta V$ detected at the sensing terminals SNS_Hi and SHS_Lo to a user, or send a warning signal to the user. If the measured response voltage does not exceed the threshold voltage, the relays KA1, KA2 will be turned on. In that case, the AC current signal generated by the AC current source will be injected into the subject battery via the testing signal circuit, and the battery response voltage detected by the response sensing terminals SNS_Hi and SNS_Lo will be conducted to the resistance measuring module via the response sensing circuit. Thus, the battery resistance can be calculated by the method described with reference to FIG. 2, and the calculated resistance can be displayed to a user by the display. Optionally, the relays KA1, KA2 can be turned off again to prepare for the next measurement after the resistance is measured. Optionally, the two relays KA1, KA2 shown in FIG. 2 may be single-pole, double-throw relays.

The switching of the relays KA1, KA2 can be automatically executed. For example, a trigger signal may be automatically generated to cause the relays to respond when the measured response voltage reaches the threshold. Alternatively, the switching of the relays KA1, KA2 can be manually operated by a user according to an indication displayed on the display.

In certain embodiments, the relay KA2 in the response sensing circuit may be replaced by a stopping capacitor. When the relay KA1 in the testing signal circuit is in the off state, the response sensing terminals SNS_Hi and SNS_Lo only detect the DC voltage across the subject battery because no AC current is injected. The stopping capacitor forms a DC open circuit in the response sensing circuit, thereby isolating the resistance measuring module. When the relay KA1 is on, the stopping capacitor will pass AC signals when the AC current is injected, and therefore the resistance measuring module will be connected into the response sensing circuit.

In FIG. 3, the voltage response signal detected by the response sensing terminal SNS_Hi can be conducted to a voltage measurement device to perform voltage measurement via voltage dividing resistors Rdiv 1 and Rdiv 2. For example, a battery tester according to the present application can provide three voltage measurement ranges including 0~6V, 6~60V, and 60~600V. Assuming the resistance of the voltage dividing resistor Rdiv 1 is chosen as 10 M$\Omega$, the resistance of the voltage dividing resistor Rdiv 2 may be chosen as 1 M$\Omega$ to divide a voltage of 6V to 0.6V in the case of voltage measurement range of 0~6V;

the resistance of the voltage dividing resistor Rdiv 2 may be chosen as 100 k$\Omega$ to divide a voltage of 60V to 0.6V in the case of voltage measurement range of 6~60V; or the resistance of the voltage dividing resistor Rdiv 2 may be chosen as 10 kΩ to divide a voltage of 600V to 0.6V in the case of the voltage measurement range of 60~600V. The configuration and resistance of the voltage dividing resistors may be chosen for different voltage measurement ranges, according to different application situations. In the case of the range of 60~600V, the measured voltage belongs to a "high voltage" group, as defined in the present application. Therefore, the circuit breaker will switch off to turn off the resistance measurement function. Otherwise, the resistance measuring component may be damaged.

Furthermore, in order to protect the battery tester from over-voltage or over-current, two levels of over-voltage protection modules and over-current protection modules are coupled in both the testing signal circuit and the response sensing circuit. The first over-voltage protection module and the first over-current protection module are configured to provide protection when the circuit breaker (for example, the relays KA1, KA2) is in the off state. As the battery bank to be tested generally has a high voltage (for example, 400V to 600V), the designed rated parameters of the first over-voltage protection module and the over-current protection module should withstand both a high voltage and current.

As shown in FIG. 3, in the testing signal circuit, the rated withstand voltage of the first over-voltage protection device DT1 is 600V, which may be implemented by, for example, a gas discharge tube, a solid discharge tube, a transient voltage suppressor (TVS device), a diode array, a voltage regulator, or a varistor. The first over-current module may be implemented by a fuse Rf, which has a designed rated current of, for example, 440 mA, and can withstand a high voltage of 600V. When the voltage applied to the testing signal circuit exceeds 600V, the first over-voltage protection module DT1 responds by conducting the high voltage to the ground, thereby protecting the relay KA1 from over-voltage. Similarly, when the current applied to the testing signal circuit exceeds 400 mA, the fuse Rf will be fused to form an open circuit, thereby protecting the relay KA1 from over-current.

In the response sensing circuit shown in FIG. 3, the design of the first over-voltage protection module DT2 is similar to the over-voltage protection module DT1 in the testing signal circuit, which has a rated withstand voltage of 600V. The first over-current protection module is implemented by a positive temperature coefficient thermistor PTC and a series resistor Rt. The resistance of the positive temperature coefficient thermistor PTC is, for example, 1.1 kΩ, and the series resistor Rt has a resistance of 1 kΩ and a rated power of 3W. The series resistor may be chosen to have a different resistance and rated power, or it may even be omitted. The positive temperature coefficient thermistor PTC may be inter-changed with the fuse in the testing signal circuit, while not affecting the over-current protection function needed in the present application. However, when the positive temperature coefficient thermistor PTC is used in the AC current injection circuit, it should choose a smaller resistance.

As shown in FIG. 3, in order to provide further protection for the circuit breaker when the circuit breaker is in the off state, a second over-voltage protection module is coupled in the testing signal circuit and the response sensing circuit, respectively, and a second over-current protection module is coupled in the testing signal circuit.

The second over-voltage protection module in the testing signal circuit may be identical or similar to that in the response sensing circuit. For example, the second over-voltage protection module may have a rated withstand voltage of 70V. The second over-voltage protection module herein may also be implemented by a gas discharge tube, a solid discharge tube, a transient voltage suppressor (TVS device), a diode array, a voltage regulator, or a varistor. When the relays KA1, KA2 are turned off to measure the battery resistance, the second over-voltage protection module may function to protect the AC current source and the resistance measuring module from over-voltage, in case the voltage applied to the testing signal circuit and the response sensing circuit exceeds 70V.

The second over-current protection module in the testing signal circuit may also be implemented by a fuse or a PTC, which has a rated withstand current of, for example, 200 mA, and is configured to protect the AC current source from over-current when the relay KA1 is turned on. Although it is not shown in FIG. 3, those skilled in the art will readily understand that other similar second over-current protection modules may also be coupled in the response sensing circuit to protect the resistance measuring module from over-current when the relay KA2 is turned on.

FIG. 3 also shows a load current measuring module that is coupled to the response sensing circuit and is configured to measure a load current in the measuring circuit when measuring battery resistance.

Figure 4:
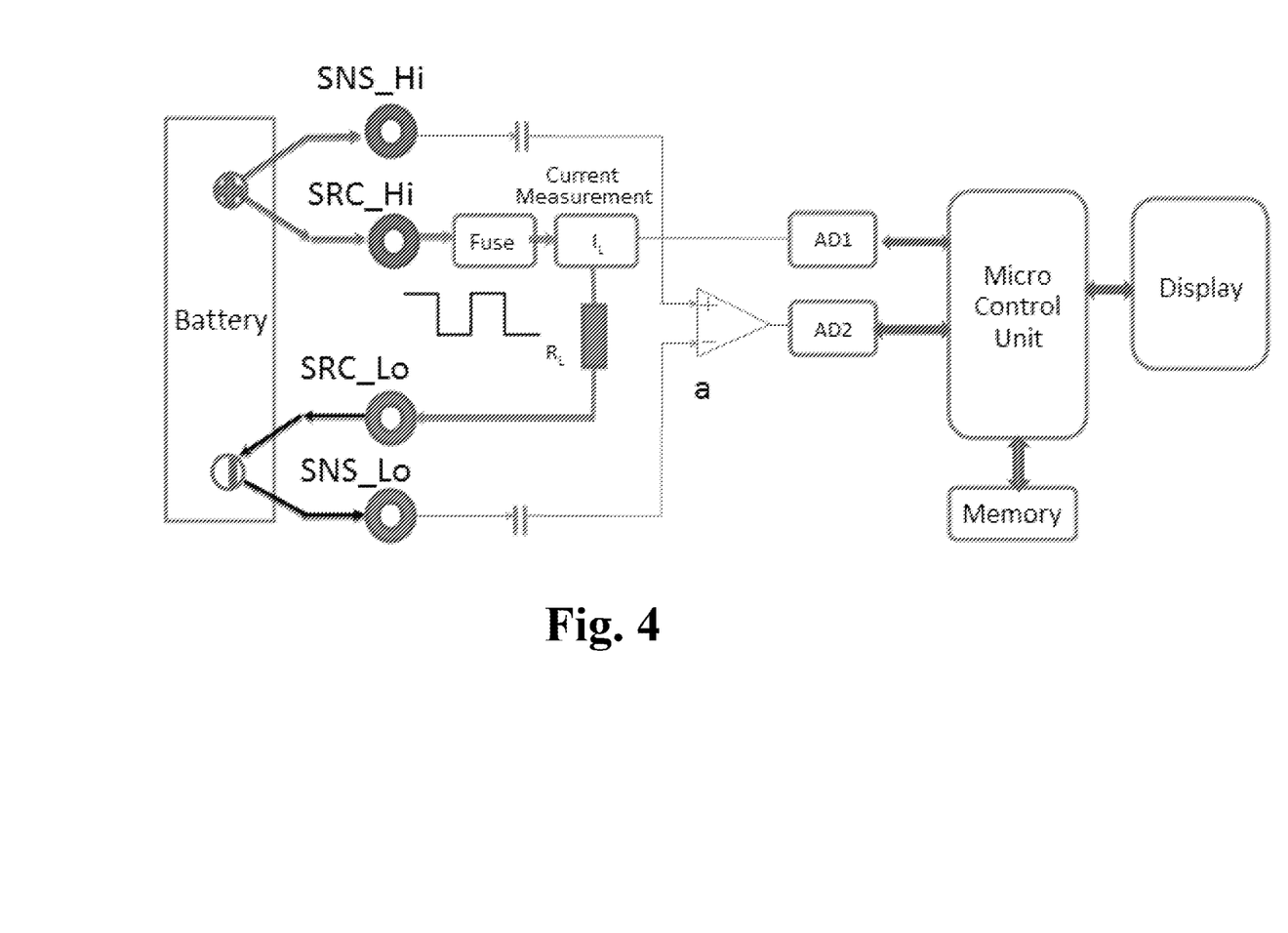
FIG. 4 shows an exemplary schematic for measuring resistance of a battery using a DC discharging method according to an embodiment of the present application.

FIG. 4 shows another embodiment of the present application, which measures the battery resistance using the DC discharging method. As shown in FIG. 4, a test load RL is coupled in the testing signal circuit. A DC current outputted from a positive electrode of a subject battery flows through the test load RL via the testing signal terminal SRC_Hi, and flows back to a negative electrode of the subject battery via the testing signal terminal SRC_Lo. The DC current outputted by the subject battery is shaped as a rectangular wave by controlling the on/off state of the testing signal circuit, thereby measuring a test current IS flowing through the test load RL. Assuming the potentials at the two electrodes of the subject battery, which are detected by the response sensing potential terminals SNS_Hi and SNS_Lo, are V_Hi and V_Lo, respectively, a voltage response signal is expressed as: $\Delta V = V\_Hi - V\_Lo$. The test current IS and the voltage response signal $\Delta V$ are transmitted to a microcontroller after analog/digital conversion. An impedance of the subject battery is expressed as $Z = \Delta V/IL$, which is calculated by the microcontroller according to Ohm's Law.

The resistance measurement using the DC discharging method can be implemented by an exemplary circuit similar to that shown in FIG. 3. For example, the circuit breaker function can also be implemented by a relay to implement switching between the resistance measurement function and other parameter measurement function, and to protect the measurement circuit with a two-level over-voltage protection and over-current protection. The difference is that the AC current source in the testing signal circuit in FIG. 3 is replaced by the test current IL, and the on/off state of the testing signal circuit is controlled to generate a rectangular wave test current.

While various aspects and embodiments of the present application have been disclosed herein, other aspects and embodiments are obvious to those skilled in the art. The aspects and embodiments disclosed herein are merely exemplary and not limiting. The scope and spirit of the present application is defined by the attached claims.

The embodiments of the invention in which an exclusive property or privilege is claimed are defined as follows:

1. A battery tester configured to measure resistance of a battery, comprising:
   a testing signal circuit;
   a response sensing circuit; and a resistance measuring module, wherein:
the testing signal circuit is configured to conduct a testing signal between the battery tester and a subject battery;
the response sensing circuit is configured to detect a response signal from the subject battery; and
the resistance measuring module is electrically coupled to the response sensing circuit and is configured to obtain a measurement of the battery resistance based on the response signal detected by the response sensing circuit,
wherein the battery tester further comprises a circuit breaker that is in an off state when the battery tester is not used to measure the battery resistance so as to disconnect the testing signal circuit from the subject battery and to disconnect the resistance measuring module from the response sensing circuit.

2. The battery tester of claim 1, wherein, prior to the measurement of the battery resistance, the response sensing circuit is configured to determine a level value of the response signal, and if the determined level value of the response signal exceeds a threshold level, the circuit breaker is in the off state, and if the determined level value of the response signal does not exceed the threshold level, the circuit breaker is in an on state so that the testing signal circuit is switched on and the resistance measuring module is electrically coupled to the response sensing circuit for measuring the battery resistance.

3. The battery tester of claim 2, wherein the determined level value of the response signal is the voltage across the subject battery.

4. The battery tester of claim 1, wherein the resistance measuring module measures the battery resistance using an AC injection method, and the testing signal circuit comprises an AC current source for inputting an alternating current signal into the subject battery via the testing signal circuit when measuring the battery resistance.

5. The battery tester of claim 1, wherein the resistance measuring module measures the battery resistance using a DC discharging method and the testing signal circuit comprises a test load, and wherein when measuring the battery resistance, a discharging current output from the subject battery flows through the test load via the testing signal circuit.

6. The battery tester of claim 1, wherein the circuit breaker is implemented by two relays coupled in the testing signal circuit and the response sensing circuit, respectively.

7. The battery tester of claim 1, wherein the circuit breaker is implemented by a single-pole, double-throw relay that controls the on/off state of the testing signal circuit and the response sensing circuit simultaneously.

8. The battery tester of claim 4, wherein the circuit breaker is implemented by a stopping capacitor in the testing signal circuit and a relay in the response sensing circuit.

9. The battery tester of claim 1, further comprising an additional measuring module for measuring one or more battery parameters other than the battery resistance.

10. The battery tester of claim 9, wherein the additional measuring module is a voltage measurement device configured to measure the voltage across the subject battery.

11. The battery tester of claim 9, wherein the battery tester is usable as a multimeter.

12. The battery tester of claim 9, wherein the circuit breaker is in an off state when the battery tester is used for measuring battery parameters other than battery resistance.

13. The battery tester of claim 1, wherein a first over-voltage protection module is coupled in the testing signal circuit to protect the circuit breaker from over-voltage when the circuit breaker is in the off state.

14. The battery tester of claim 1, wherein a first over-voltage protection module is coupled in the response sensing circuit to protect the circuit breaker from over-voltage when the circuit breaker is in the off state.

15. The battery tester of claim 1, wherein a first over-voltage protection module is coupled in the testing signal circuit and the response sensing circuit, respectively, to protect the circuit breaker from over-voltage when the circuit breaker is in the off state.

16. The battery tester of claim 13, wherein a rated value of the protection voltage of the first over-voltage protection module is 600V.

17. The battery tester of claim 13, wherein the first over-voltage protection module is selected from the group consisting of: a gas discharge tube, a solid discharge tube, a transient voltage suppressor, a diode array, a voltage regulator, and a varistor.

18. The battery tester of claim 1, wherein a first over-current protection module is coupled in the testing signal circuit to protect the circuit breaker from over-current when the circuit breaker is in the off state.

19. The battery tester of claim 1, wherein a first over-current protection module is coupled in the response sensing circuit to protect the circuit breaker from over-current when the circuit breaker is in the off state.

20. The battery tester of claim 1, wherein a first over-current protection module is coupled in the testing signal circuit and the response sensing circuit, respectively, to protect the circuit breaker from over-current when the circuit breaker is in the off state.

21. The battery tester of claim 18, wherein the first over-current protection module is a positive temperature coefficient thermistor or a fuse.

22. The battery tester of claim 1, wherein a second over-voltage protection module is coupled in the testing signal circuit to protect the testing signal circuit from over-voltage when the circuit breaker is in an on state.

23. The battery tester of claim 1, wherein a second over-voltage protection module is coupled in the response sensing circuit to protect the resistance measuring module from over-voltage when the circuit breaker is in an on state.

24. The battery tester of claim 1, wherein a second over-voltage protection module is coupled in the testing signal circuit and the response sensing circuit, respectively, to protect the testing signal circuit and the resistance measuring module from over-voltage when the circuit breaker is in an on state.

25. The battery tester of claim 22, wherein a rated value of the protection voltage of the second over-voltage protection module is 70V.

26. The battery tester of claim 22, wherein the second over-voltage protection module is selected from the group consisting of: a gas discharge tube, a solid discharge tube, a transient voltage suppressor, a diode array, a voltage regulator, and a varistor.

27. The battery tester of claim 1, wherein a second over-current protection module is coupled in the testing signal circuit to protect the testing signal circuit from over-current when the circuit breaker is in an on state.

28. The battery tester of claim 1, wherein a second over-current protection module is coupled in the response sensing circuit to protect the resistance measuring module from over-current when the circuit breaker is in an on state.

29. The battery tester of claim 1, wherein a second over-current protection module is coupled in the testing signal circuit and the response sensing circuit, respectively, to protect the testing signal circuit and the resistance measuring module from over-current when the circuit breaker is in an on state.

30. The battery tester of claim 27, wherein the second over-current protection module is a positive temperature coefficient thermistor or a fuse.

31. The battery tester of claim 1, further comprising a load current measuring module electrically coupled to the response sensing circuit and configured to measure a load current.

32. The battery tester of claim 1, further comprising a pair of test probes, wherein each of the test probes is electrically coupleable to the testing signal circuit and the response sensing circuit.

33. The battery tester of claim 1, further comprising a display configured to display a level of the response signal detected by the response sensing circuit and/or a value measured by the battery tester.

34. The battery tester of claim 2, wherein the battery tester is configured to give a warning signal if the determined level value of the response signal exceeds the threshold level.

\* \* \* \* \*